United States Patent [19]
Emerson

[11] Patent Number: 4,799,130
[45] Date of Patent: Jan. 17, 1989

[54] DIELECTRIC STRENGTH TESTER

[75] Inventor: Wayne C. Emerson, Black Creek, N.Y.

[73] Assignee: Acme Electric Corporation, Olean, N.Y.

[21] Appl. No.: 79,129

[22] Filed: Jul. 29, 1987

[51] Int. Cl.⁴ .................. H02H 00/00; G08B 21/00
[52] U.S. Cl. ............................. 361/437; 336/198; 307/326
[58] Field of Search .................. 324/510, 511, 555; 361/45; 307/326; 340/650, 651; 336/198, 208

[56] References Cited

U.S. PATENT DOCUMENTS

| | | | |
|---|---|---|---|
| 2,743,396 | 4/1956 | Goldsborough | 324/509 |
| 2,858,507 | 10/1958 | Liautaud et al. | 324/511 |
| 3,187,225 | 6/1965 | Mayer | 361/65 |
| 3,252,052 | 5/1966 | Nash | 361/45 |
| 3,312,862 | 4/1967 | Currin | 361/45 |
| 3,356,939 | 12/1967 | Stevenson | 324/509 |
| 3,419,756 | 12/1968 | Philibert et al. | 361/48 |
| 3,555,360 | 1/1971 | Lee et al. | 361/45 |
| 3,641,393 | 2/1972 | Florance et al. | 361/45 |
| 3,668,470 | 6/1972 | Ambler et al. | 361/45 |
| 3,723,815 | 3/1973 | Ambler et al. | 361/45 |
| 3,764,853 | 10/1973 | Beachley, Jr. | 340/650 |
| 3,784,842 | 1/1974 | Kremer | 340/650 |
| 3,978,400 | 8/1976 | Pettit | 340/650 |

FOREIGN PATENT DOCUMENTS 2819204 11/1979 Fed. Rep. of Germany ........ 361/45

Primary Examiner—L. T. Hix
Assistant Examiner—David Porterfield
Attorney, Agent, or Firm—Pearne, Gordon, McCoy & Granger

[57] ABSTRACT

A dielectric strength tester is disclosed for use with high-voltage, high-volt amperage electrical equipment. The step-up transformer has a high-voltage secondary winding which is connected through first and second primary windings of a sensing transformer to first and second test terminals. If an operator should contact the second test terminal, which is at high voltage, this would cause a fault-to-ground current, which is an imbalance on the two primary windings, and hence supply an output on the secondary winding of the sensing transformer. This voltage is rectified and passed through a set point resistor means to trigger a thyristor into conduction. This thyristor is connected to de-energize a triac in series with the primary of the step-up transformer. The sensing is rapid because it is carried out in the high voltage secondary, yet the control is in the lower voltage primary of the step-up transformer. The response is very rapid, taking place in less than one-half a millisecond, so that should an operator receive a shock, it would not be a fatal shock and he would be able to let go of the electrical contact. The fore-going abstract is merely a resume of one general application, is not a complete discussion of all principles of operation or applications, and is not to be construed as a limitation on the scope of the claimed subject matter.

14 Claims, 2 Drawing Sheets

DIELECTRIC STRENGTH TESTER

BACKGROUND OF THE INVENTION

Ground fault detecting systems have been suggested in the past, for example, U.S. Pat. No. 2,743,396, which utilizes a differential transformer. It has been suggested to utilize a bridge rectifier to rectify the unbalanced signal, for example, in U.S. Pat. Nos. 3,187,225 and 3,978,400. It has also been suggested to utilize a variable resistance of some kind to set a trip point of the circuit, for example, in U.S. Pat. Nos. 3,978,400 and 3,252,052. A number of the prior art circuits have been ones which controlled a relay or circuit breaker, as in U.S. Pat. Nos. 3,356,939; 3,419,756, and 3,555,360. U.S. Pat. Nos. 3,641,393 and 3,668,470 utilize a triac in series with the line to the load. Still other patents, such as U.S. Pat. No. 3,764,853, utilize a triac, but the triac controls a circuit breaker. Still another patent, U.S. Pat. No. 3,784,842, has suggested a body current sensing device to detect current through the body to control a current interruption circuit.

SUMMARY OF THE INVENTION

The problem to be solved is how to construct a high voltage and high volt-ampere dielectric tester which is inherently dangerous to operate so that the operator will not suffer a severe shock. The prior art units which utilized relays and circuit breakers were inherently slow in operation, with circuit interruption times typically being 1/10 second to a few seconds. Also a control circuit is desired which does not require any connections to the operator of the equipment.

This problem is solved by a high voltage, high volt-amperage dielectric strength tester for use with electrical equipment, comprising in combination a step-up transformer having a primary winding and a high voltage secondary winding of amperage capacity exceeding ten milliamps, means to energize the primary winding of said step up transformer through a first semiconductor switch, means connecting a part of said secondary winding of said step-up transformer to ground, first and second test terminals adapted to be connected to electrical equipment for dielectric tests, means connecting said first and second test terminals to opposite ends of said secondary winding of said step-up transformer, sensing means having an output winding and connected to be responsive to an imbalance of current flow through said first and second test terminals, and normally developing, without a ground fault, substantially zero current in said output winding, and a control circuit connected to control the energization of said first semiconductor switch, said control circuit including input means from said output winding of said sensing means, a second semiconductor switch having a control element and connected to control energization and de-energization of said first semiconductor switch, and means connecting said input means to said control element of said second semiconductor switch to control the conduction condition thereof upon the current on said output winding of said sensing means exceeding a set point such as by a fault-to-ground on said step-up transformer secondary winding.

Accordingly, an object of the invention is to provide a ground fault interrupter circuit for a high voltage and high volt-amperage test device.

Another object of the invention is to provide a ground fault interrupter circuit which is fast-acting by sensing on the secondary side of a step-up transformer.

Other objects and a fuller understanding of the invention may be had by referring to the following description and claims, taken in conjunction with the accompanying drawing.

DESCRIPTION OF THE PREFERRED EMBODIMENT

Figure 1:
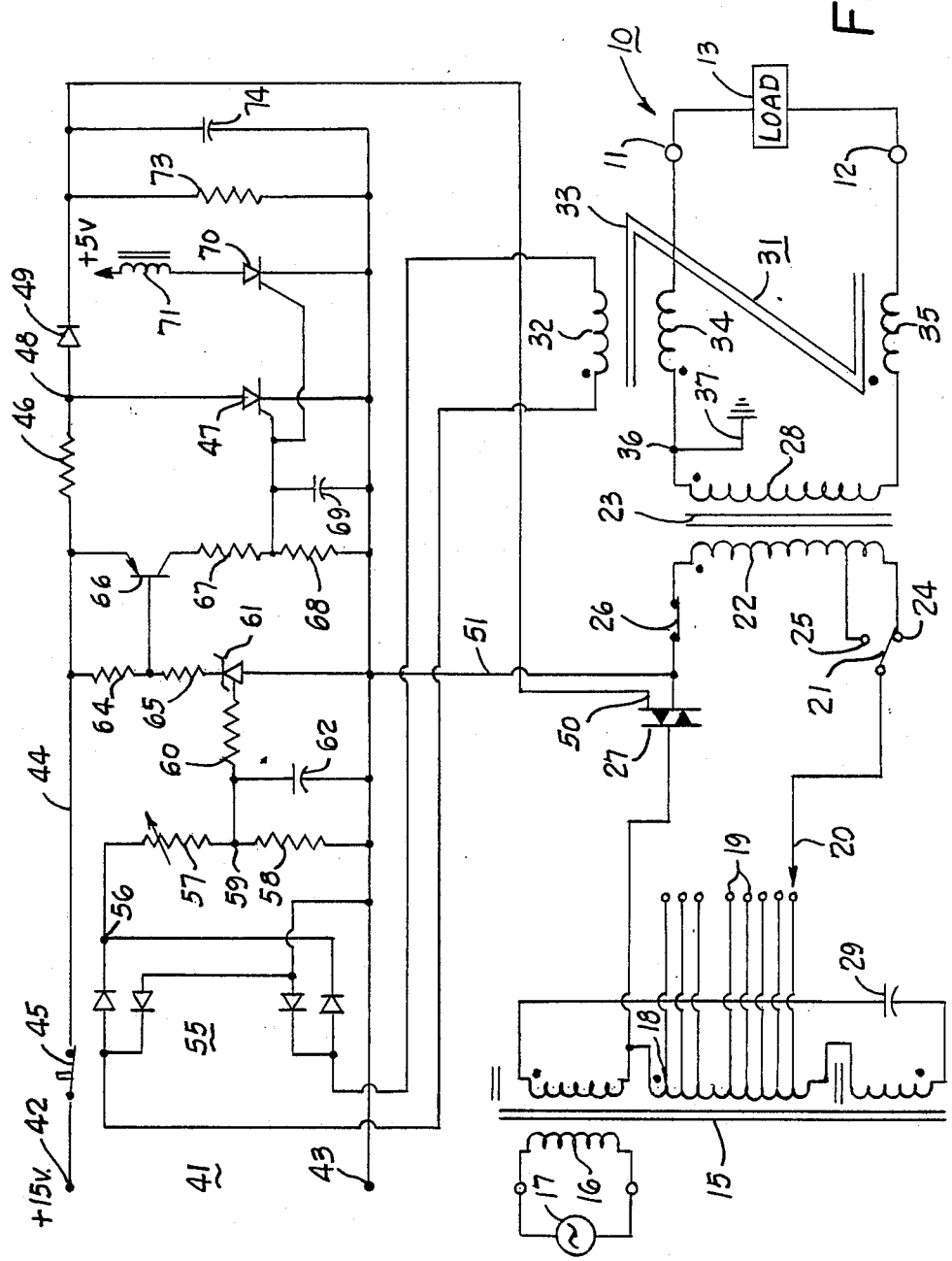
FIG. 1 is a schematic diagram of the circuit embodying the invention.

FIG. 1 illustrates a dielectric strength tester 10 which is inherently dangerous to the operator because it is not only high voltage but also high volt-amperage. This dielectric strength tester is for use with electrical equipment, such as for testing the insulation or dielectric of transformers, motors, and generators. Underwriters Laboratories or other standard review boards require a certain ability to withstand high voltage relative to ground without shorting out. A typical rule-of-thumb is that the insulated electrical winding should be able to withstand twice-rated voltage plus 1000 volts for one minute without arcing or shorting to ground or some exposed metal part. As an alternative, Underwriters Laboratories permits a 20% boost in the voltage for one second rather than one minute, and this is often used in production to increase the speed of completion of the test procedure.

In dielectric strength testing of large electrical equipment, it is often necessary to have an output rating of the tester of 4800 volts at 500-volt amperes. This requires over 100 miliamperes of current as a minimum, well above the 5-milliampere rating typically used for small transformers or electrical equipment. The threshold of let-go current passing through the human body is recognized to be 10 milliamperes. A current higher than that value passing through the body results in contraction of the muscles, which may not allow that person to let go of the electrical contact. Therefore, the test equipment of this high volt-ampere rating must be recognized as potentially dangerous to an operator.

The circuit of FIG. 1 is designed to reduce the danger of electrical shock.

The dielectric strength tester 10 has first and second test terminals 11 and 12 adapted to be connected to an electrical equipment load 13 under dielectric test. The tester 10 is powered by a leakage reactance transformer 15 which has a primary 16 connectable to a commercially available power source 17, such as 115 volts, 60 Hz. A secondary winding 18 on the transformer has a plurality of taps 19 so that a number of different specified voltages are readily obtainable, for example from 23 volts to 184 volts. A movable contact 20 coacts with the plural taps 19 to select the desired voltage and leads through a 20% boost switch 21 to the primary winding 22 of a step-up transformer 23. The switch 21 has a normal position 24 and a boost position 25. The other end of the primary winding 22 is connected through a remote ON/OFF switch 26 and through a triac 27 to return to the secondary winding 18 of transformer 15.

Sensing means 31 is provided to sense any imbalance of current flow through the first and second test terminals 11 and 12. Under normal conditions, without any ground fault or short-to-ground, substantially zero current is developed in an output winding 32 of the sensing means. In the preferred embodiment, this sensing means includes a sensing transformer with a core 33 on which first and second primary windings 34 and 35, respectively, are wound on a split bobbin 40 with two separate sections 38 and 39 so that one winding is provided in each of the two sections. The output winding 32 is a secondary winding wound on top of one of the primary windings. These windings being provided in separate sections of the split bobbin provide a maximum of voltage isolation.

The secondary winding 28 of the step-up transformer 23 has a high voltage because of a high ratio, for example 15:1 or 20:1, and hence is capable of having an output of from 400 volts to 4800 volts at 500-volt amperes in this preferred embodiment. One end of the secondary winding 28 is connected through the primary winding 34 to the first test terminal 11, and the other end of the secondary winding 28 is connected through the other primary winding 35 to the test terminal 12. The secondary windings 34 and 35 are connected in reverse polarity insofar as developing an output on the secondary winding 32, so that, normally, without a ground fault, there is zero current flowing in on this output or secondary winding 32. A part of the secondary winding 28 is connected to equipment ground, and preferably to earth ground, and in the preferred embodiment, one end terminal 36 of this secondary winding 28 is grounded at 37. This makes the first test terminal 11 substantially at ground potential and makes only the second test terminal 12 a high potential so that it is potentially dangerous to the operator.

The tester 10 includes a control circuit 41 which has an input from the sensing transformer secondary winding 32. The control circuit 41 has a DC input at a positive terminal 42 relative to a negative DC terminal 43. Terminal 42 is capable of energizing a positive lead 44 through a normally closed control switch 45. A resistor 46 is connected in series with a second semiconductor switch or thyristor 47, with an intermediate control terminal 48, and this series combination is across the line 44 and negative terminal 43. A diode 49 has the anode thereof connected to the control terminal 48 and the cathode connected to the gate 50 of the first semiconductor switch or triac 27. The negative terminal 43 is connected by a line 51 to one of the main electrodes of the triac 27.

The secondary winding 32 of the sensing transformer 31 supplies the current thereof to a bridge rectifier 55, and the output of this bridge rectifier applied to a rheostat 57 and a resistor 58 in series with an intermediate terminal 59. A positive voltage at a terminal 56 relative to the negative terminal 43 is developed by this rectified current. The variation of the rheostat 57 varies the set point output at the terminal 59, and this is applied through a resistor 60 to the control terminal of an adjustable voltage regulator 61, which is used as a current gain amplifier. A capacitor 62 is connected in parallel with the resistor 58. Resistors 64 and 65 are connected in series with the adjustable voltage regulator 61 from line 44 to the negative terminal 43. The junction of the resistors 64 and 65 is connected to the base of a transistor 66, with the emitter connected to line 44. The collector is connected through resistors 67 and 68 to the negative terminal 43. A capacitor 69 is connected across resistor 68 and the junction of resistors 67 and 68 is connected to the gate of the thyristor 47, as well as to the gate of an indicator thyristor 70. An input/output signal relay 71 is connected between a DC voltage source and the negative terminal 43 through the indicator thyristor 70. This provides a visual indication of the status of the control circuit output. A resistor 73 and capacitor 74 are connected in parallel across the cathode of the diode 49 and the negative terminal 43.

Operation

The dielectric strength tester 10 is adapted to be connected to electrical equipment, such as the load 13, to test the dielectric strength thereof. A typical test required by Underwriters Laboratories is that the insulation between conductor and ground shall withstand twice the rated voltage plus 1000 volts for one minute or, alternatively, with a 20% boost of voltage for one second, without arcing from the current conductor to ground. In production, where manufactured electrical equipment is being tested, and especially where it is 100% tested before delivery, it is often desired not to delay the testing by the full one-minute test. Instead, the 20% boost for voltage for one second is often used. Accordingly, the dielectric strength tester 10 of the present invention is so equipped with the boost switch 21.

In the testing of small electrical equipment, often the high voltage testing has only about 5 milliamp rating, and hence, even if the operator of the test equipment should receive a shock, this is not a sufficiently high current rating that the operator cannot let go of the electrical contact or terminal which he has inadvertently touched. However, the present tester is capable of an output current rating of 500-volt amperes divided by 4800 volts equals 104 milliamp minimum. The threshold of let-go current passing through the human body is recognized to be 10 milliamps, which means that a current higher than that value passing through the body results in contraction of the muscles, which may not permit that person to let go of the electrical contact. Therefore, the test terminal 12 could be inherently dangerous to an operator except for the safety measures built into the present tester 10.

The nature of this test equipment dictates that the high voltage output lead or test terminal 12 be accessible to the operator, for connection to the equipment to be tested. This is the most likely and the most dangerous part of the circuit for electrical contact and shock hazards. This circuit for the tester is applicable where high voltage arcing is expected, for example, when the insulation on the equipment under test fails.

The leakage reactance transformer 15 has the plurality of taps 19 so that the operator may select the appropriate voltage for the equipment under test. This voltage may be anywhere from 400 to 4000 volts, and with the 20% boost switch 24, this can boost it to 500 to 4800 volts. The remote ON/OFF switch 26 can be used to de-energize the step-up transformer 23 until after the operator connects the test terminals to the electrical equipment 13 to be tested. This will provide a safety factor of de-energization of the test terminal 12. However, should the operator neglect to open the remote ON/OFF switch, the circuit of the tester 10 will still protect the operator, who might inadvertently contact the test terminal 12. If this is the case, with this terminal energized at high voltage, the operator still will be able to let go of that contact.

The step-up transformer 23 has a step-up ratio of about 20:1, and the sensing transformer 31 is a sensing means to sense any imbalance of current flow through the first and second test terminals 11 and 12, respectively. Under normal conditions, without any fault-to-ground current, the current flow through the two test terminals will be equal, and hence zero current and zero ampere-turn product will be developed on the secondary winding 32. If there should be a fault-to-ground current flow on the terminal 12, for example, should the operator actually inadvertently touch the test terminal 12, there would be an imbalance of current flow through the two primary windings 34 and 35, because more current would be flowing through primary winding 35 than through primary winding 34. This imbalance will provide a response at the secondary winding 32, which is rectified by bridge rectifier 55 and applied to the set point resistors 57 and 58. This will trigger the adjustable voltage regulator 61 into conduction, trigger transistor 66 into conduction, and trigger the thyristor 47 into conduction. This latter conduction will bring the control terminal 48 down to essentially zero voltage, whereas, previously, the voltage thereat was near the 15-volt potential of the positive DC terminal 42. This high voltage at the control terminal 48 is no longer being applied through the diode 49 to the gate 50; hence, the triac 27 will be turned off. It will be noted that the first semiconductor switch 27 has an opposite conduction characteristic to that of the second semiconductor switch 47, namely, an ON condition of thyristor 47 means an OFF condition of triac 27 and an OFF condition of thyristor 47 means an ON condition of triac 27.

The set point of turn on of the second semiconductor switch 47 may be set by the rheostat 57. An advantage of the present invention is fast response. Many of the prior art patents make use of circuit breakers or relays. Both of these are usually mechanical devices which require physical movement of parts. Circuit interruption times are typically 1/10 second to a few seconds. Solid-state relays 27 and 47, however, are much faster. The present circuit includes first and second semiconductor switches 27 and 47, which can open the circuit very quickly, only a few microseconds, e.g., 10 microseconds.

With commercially available 60 Hz power frequencies, a person can receive a pulse of electric shock 120 times per second, or one pulse every 8.3 milliseconds. The present circuit is fast enough to turn off the electrical current on the very first pulse that the shock begins instead of 12 to 1000 pulses later. Since the current is turned off on the very first pulse, the operator may receive a slight shock, but it will not be continued long enough to be seriously damaging to the operator, and also since it is not continued, the operator will be able to let go of the electrical contact.

The capacitors 62 and 69 provide damping to prevent nuisance shutdown from arcing and high frequency noise, yet the RC time constants in a circuit constructed in accordance with the present invention are 330 microseconds and 24 microseconds, respectively, which allows extremely fast circuit operation and shutdown for any ground fault.

In the circuit constructed in accordance with the invention, the values of the circuit components were as set forth in Table A.

TABLE A

| Resistors | Capacitors |
|---|---|
| 46 200 ohms, 2 watt | 29 12 mfd, 660 v. |
| 57 3.3K ohms | 62 .1 µf |
| 58 2.4K ohms | 69 .01 µf |
| 60 100 ohms | 74 .01 µf |
| 64 330 ohms | |
| 65 2.4K ohms | Semiconductors |
| 67 2.4K ohms | 47 C203A |
| 68 330 ohms | 61 TL 431 |
| 73 330 ohms | 66 2N3905 |
| | 70 C203A |

The sensing transformer 31 was constructed using a core of EI 875 29 gauge, M6, silicon steel laminations. It was interleaved and a one-inch stack provided. The primary winding 34 was wound with 480 turns of No. 32AWG magnet wire in one section 38 of a split bobbin 40. The second primary winding 35 was wound with 480 turns of No. 32 magnet wire in the other section 39 of the split bobbin. The secondary winding 32 was wound with 70 turns of the same wire size, over the primary winding 34.

Figure 2:
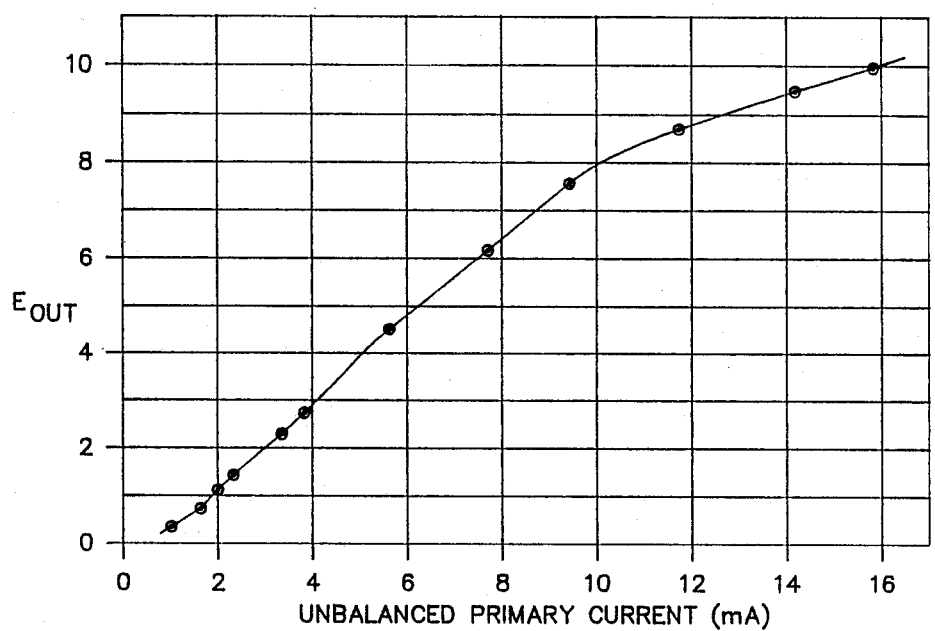
FIG. 2 is a graph of voltage-versus current in the sensing transformer used in the circuit.
Figures 3, 4:
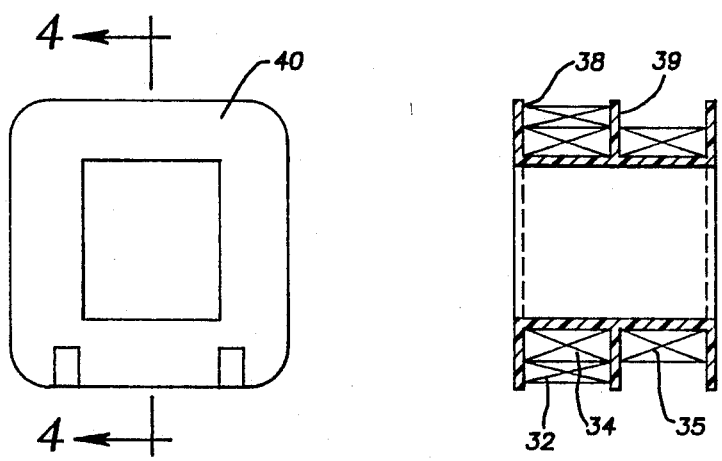
FIG. 3 is a plan view of a split bobbin.
FIG. 4 is a cross-sectional view on line 4—4 of FIG. 3.

If any shutdown should occur, the thyristor 47 latches on, so that the output power of the tester 10 remains off until the control switch 45 is manually opened and closed. The indicator thyristor 70 and relay 71 are used to provide a visual indication on the front panel that ground fault current "tripping" has occurred. The output current to the equipment under test can be 0, 5, 100, or even 200 milliamps, but if there is a ground fault current, e.g., to the operator, of only 4 or 5 milliamps, the sensing transformer 31 can shut down the equipment. FIG. 2 illustrates the voltage on the secondary winding 32 of the sensing transformer versus the imbalance of current on the two primary windings 34 and 35. This shows that with 5 milliamps of imbalance of current, 4 volts output is achieved, which can easily be set to trip the control circuit 41 and cause conduction of thyristor 47, and hence shutdown of the triac 27. It will be noted that the resistor/capacitor combinations 57–62 and 67–69 have a combined time constant of less than one-half millisecond to achieve this fast response of the control circuit 41 in shutting down the triac 27.

The present disclosure includes that contained in the appended claims, as well as that of the foregoing description. Although this invention has been described in its preferred form with a certain degree of of particularity, it is understood that the present disclosure of the preferred form has been made only by way of example and that numerous changes in the details of the circuit and the combination and arrangement of circuit elements may be resorted to without departing from the spirit and the scope of the invention as hereinafter claimed.

What is claimed is:

1. A high voltage, high volt-amperage dielectric strength tester for use with electrical equipment, comprising in combination:

a step-up transformer having a primary winding and a high voltage secondary winding of amperage capacity exceeding ten milliamps;

means to energize the primary winding of said step-up transformer through a first semiconductor switch;

means connecting a part of said secondary winding of said step-up transformer to ground;

first and second test terminals adapted to be connected to electrical equipment for dielectric tests;

means connecting said first and second test terminals to opposite ends of said secondary winding of said step-up transformer;

sensing means having an output winding and connected to be responsive to an imbalance of current flow through said first and second test terminals, and normally developing, without a ground fault, substantially zero current in said output winding; and a control circuit connected to control the energization of said first semiconductor switch, said control circuit including input means from said output winding of said sensing means;

a second semiconductor switch having a control element and connected to control energization and de-energization of said first semiconductor switch; and means connecting said input means to said control element of said second semiconductor switch to control the conduction condition thereof upon the current on said output winding of said sensing means exceeding a set point such as by a fault-to-ground on said step-up transformer secondary winding.

2. A dielectric strength tester as set forth in claim 1, wherein said sensing means includes a sensing transformer.

3. A dielectric strength tester as set forth in claim 1, wherein said sensing means includes a sensing transformer having first and second primary winding means responsive to current flow through said first and second test terminals, respectively.

4. A dielectric strength tester as set forth in claim 3, wherein said first and second primary windings of said sensing transformer are wound in different sections of a split bobbin for good voltage isolation.

5. A dielectric strength tester as set forth in claim 1, wherein said first semiconductor switch is a triac.

6. A dielectric strength tester as set forth in claim 1, wherein said part of said secondary winding of said step-up transformer connected to earth ground is one end of the secondary winding.

7. A dielectric tester as set forth in claim 1, wherein said control circuit includes rectifier means to rectify the current of the output winding of said sensing means.

8. A dielectric tester as set forth in claim 1, including in said control circuit a set point resistor having an input connected to said rectifier output and having a variable voltage output.

9. A dielectric tester as set forth in claim 1, wherein said second semiconductor switch includes a thyristor.

10. A dielectric tester as set forth in claim 1, wherein said second semiconductor switch is connected to permit energization of said first semiconductor switch upon de-energization of said second semiconductor switch and to de-energize said first semiconductor switch upon energization of said second semiconductor switch.

11. A dielectric tester as set forth in claim 1, wherein said first semiconductor switch has a control electrode and a main electrode; and means to connect said second semiconductor switch across said control electrode and main electrode of said first semiconductor switch.

12. A dielectric tester as set forth in claim 1, including in said control circuit resistor/capacitor means having a time constant less than one-half cycle of the frequency of the voltage applied to said step-up transformer.

13. A dielectric tester as set forth in claim 12, wherein said time constant is less than one-half millisecond.

14. A dielectric tester as set forth in claim 1, wherein said control circuit includes a DC input;

a resistor connected in series with said second semiconductor switch across said DC input; and said second semicondcutor switch being connected to said first semiconductor switch for alternative conduction.

* * * * *